(12) United States Patent
Farnworth et al.

(10) Patent No.: US 6,297,542 B1
(45) Date of Patent: Oct. 2, 2001

(54) CONNECTING A DIE IN AN INTEGRATED CIRCUIT MODULE

(75) Inventors: Warren M. Farnworth, Nampa; Larry D. Kinsman, Boise; Walter L. Moden, Meridian, all of ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/104,827

(22) Filed: Jun. 25, 1998

(51) Int. Cl.$^7$ .................................................... H01L 23/495
(52) U.S. Cl. ........................ 257/666; 257/726; 257/727
(58) Field of Search ................................. 257/696, 726, 257/727, 666

(56) References Cited

U.S. PATENT DOCUMENTS

| | | |
|---|---|---|
| 5,104,324 | 4/1992 | Grabbe et al. . |
| 5,291,061 | 3/1994 | Ball . |
| 5,323,060 | 6/1994 | Fogal et al. . |
| 5,663,596 | * 9/1997 | Little ...................................... 257/696 |
| 5,677,567 | 10/1997 | Ma et al. . |
| 6,025,730 | 2/2000 | Akram et al. ......................... 324/758 |
| 6,037,669 | 3/2000 | Shu et al. .............................. 257/786 |
| 6,151,220 | * 11/2000 | Sakamoto et al. .................... 257/726 |

OTHER PUBLICATIONS

US Patent Application Serial No. 08/818,456, entitled Direct Connect Interconnect for Testing Semiconductor Dice and Wafers, filed Mar. 17, 1997.
US Patent Application Serial No. 08/905,602 entitled Direct Die Contact (DDC) Semiconductor Package, filed Aug. 4, 1997.
US Patent Application Serial No. 08/948,120, entitled Chip Leads Constrained in Dielectric Media and Methods of Chip Testing, filed Oct. 9 1997.

* cited by examiner

*Primary Examiner*—Roy Potter
(74) *Attorney, Agent, or Firm*—Trop, Pruner & Hu, P.C.

(57) ABSTRACT

An integrated circuit module having sockets adapted to receive direct die contact (DDC) dies. Bond pads on each DDC die is arranged such that they are displaced with respect to one another along a particular direction. Each socket of a module includes spring arms adapted to contact the bond pads so configured on the die. The socket includes multiple types of spring arms of varying lengths.

24 Claims, 6 Drawing Sheets

CONNECTING A DIE IN AN INTEGRATED CIRCUIT MODULE

BACKGROUND

The invention relates to connecting a die in an integrated circuit module.

In a multi-chip module (MCM), a number of integrated circuit dies and associated discrete chips are placed on a single interconnecting substrate. In this manner, very high pin counts can be achieved internally on the MCM interconnecting substrate, with the MCM package providing fewer output pins than are found internally.

A number of techniques exist to attach the dies to the substrate in an MCM device, including wire bonds, flip chip solder bumps, tape automated bonding leads, and microbump bonds. The entire assembly is then packaged using packaging techniques common to single chip modules.

Multi-chip modules can also be fabricated using packages that contain sockets having channels or slots configured to receive bare dies, such as the multi-chip module connector disclosed in U.S. Pat. No. 5,104,324. Such multi-chip modules are referred to as direct die contact (DDC) modules. The sockets in the DDC modules allow the bare dies to be mounted perpendicularly with respect to the interconnecting substrate of the module, thereby achieving higher device density in an MCM. Spring arms are provided in each socket to electrically contact corresponding bond pads of the die inserted into the socket. The spring arms are aligned with respect to the die bond pads in each socket.

With improvement in process technology, die sizes are steadily being reduced. Due to the smaller die sizes, the overall size of the bond pads on each die and the pitch between bond pads are proportionately reduced. This may affect the alignment of the die bond pads to spring arms in the socket of a DDC multi-chip module.

SUMMARY

Generally, the invention is directed to a socket that receives a bare die and provides contacts of varying lengths to align properly to bond pads on the die, the bond pads arranged such that they are displaced with respect to one another along one particular direction.

Among the advantages of the invention is that reliable contacts can be made with bond pads of a reduced size die inserted into a direct die contact socket. Accurate alignment of the contacts in the socket to the die bond pads can be achieved. On smaller dies in which bond pads are densely populated, the contacts of the sockets can properly align to the corresponding bond pads while still satisfying minimum pitch requirements between contacts. Further, the alignment is tolerant of variations of die sizes (such as due to variances in wafer cutting) that can cause the position of a die to be shifted in the socket.

In general, in one aspect, the invention features an integrated circuit module that includes a die having bond pads in a socket adapted to receive the die. Contacts having varying lengths are disposed in the socket to electrically contact the bond pads on the die.

In general, in another aspect, the invention features a chip-carrying module including a socket for receiving a die having first and second sets of bond pads. A first contact having a first length is disposed in a socket for electrically contacting the first set of bond pads on the die, and a second contact having a second length is disposed in the socket for electrically contacting to a second set of bond pads on the die. The first length is different from the second length.

In general, in another aspect, the invention features a semiconductor module having a die with bond pads that are displaced with respect to one another along a particular direction. A socket is configured to receive the die, the socket having contacts for electrically contacting the die.

In general, in another aspect, the invention features a method of creating an integrated circuit module. Bond pads are formed on a die that are displaced with respect to one another along a particular direction. Contacts are formed in a socket. The die is inserted into the socket, the contacts being arranged to contact bond pads upon insertion.

In general, in another aspect, the invention features an apparatus for forming electrical connections to bond pads on a die. The apparatus includes a socket for receiving the die, and contacts are formed inside the socket to contact the bond pads. The contacts have varying lengths.

Other features and advantages will become apparent from the following description and from the claims.

DETAILED DESCRIPTION

In this description, a die that includes bond pads configured to be directly contacted in a socket of a module is referred to as a direct die contact (DDC) die. Similarly, a socket in a module configured to receive a DDC die is referred to as a DDC socket, and a module including DDC sockets and dies is referred to as a DDC module.

Figure 1:
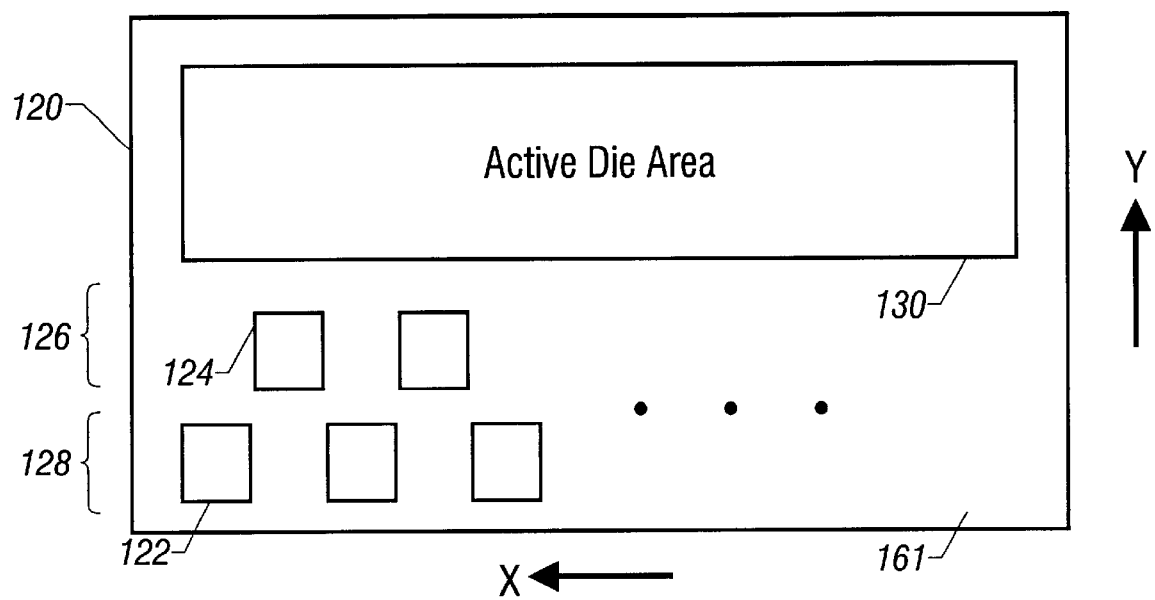
FIG. 1 is an enlarged, schematic top plan view of a die having a first configuration.

Referring to FIG. 1, according to one embodiment, a DDC die 120 for insertion into a DDC module to form an integrated circuit device includes generally two rows (126 and 128) of bond pads and an active die area 130 (which includes the active devices of the integrated circuit device). Bond pads 122 are located in the first row 128, while bond pads 124 are located in the second row 126. Windows are formed through the passivation (or overcoat) layer 161 covering the surface of the die 120 to allow electrical contact to the bond pads 122 and 124. The passivation layer can include phosphosilicate glass (PSG), silicon nitride, or silicon dioxide and serves to seal the device structures on the die from contaminants and moisture.

To avoid shorts between contacts made to the bond pads, a minimum pitch is required between adjacent bond pads.

An exemplary minimum pitch can be in the range of about 8 mils to 15 mils. However, as die sizes decrease, such predetermined minimum pitches cannot be maintained while still keeping the same number of bond pads in one row on the die. To accommodate the same number of bond pads on a reduced size die, the bond pads 122 and 124 of the die 120 are successively displaced with respect to one another along a direction indicated as Y. By doing so, the distance between adjacent bond pads 122 and 124 in the X direction (i.e., the pitch) can be reduced. Because of the displacement along the Y direction (also referred to as vertical displacement) of the bond pads, the risk of shorts between contacts due to the reduced pitch of the bond pads is reduced.

Figure 3:
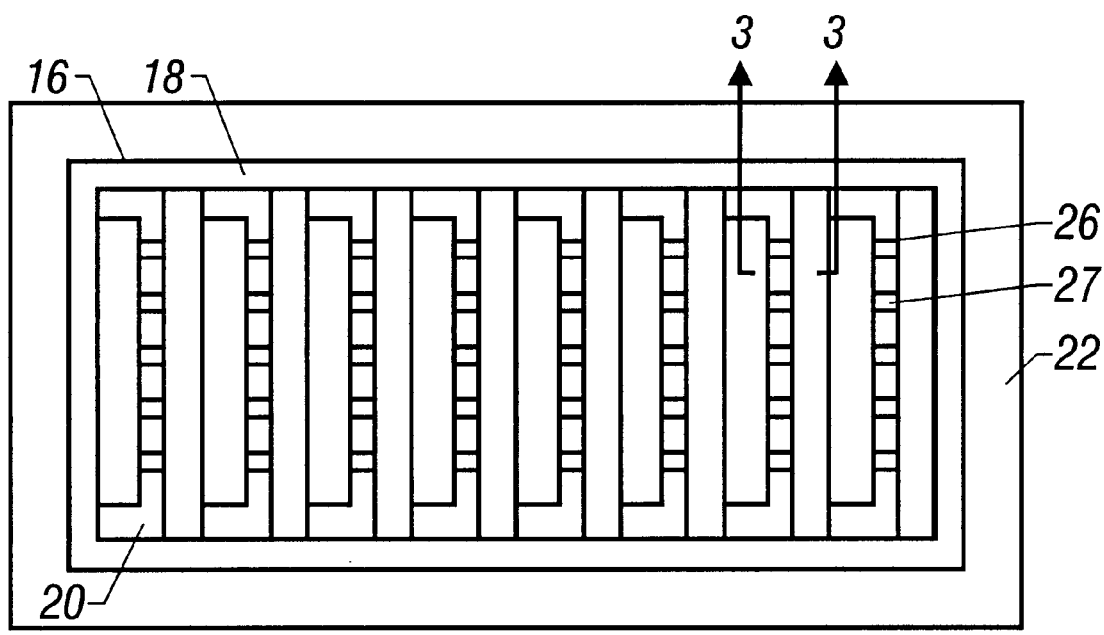
FIG. 3 is an enlarged, schematic top plan view of a module according to one embodiment of the invention that has sockets adapted to receive the die of FIG. 1.
Figure 4A:
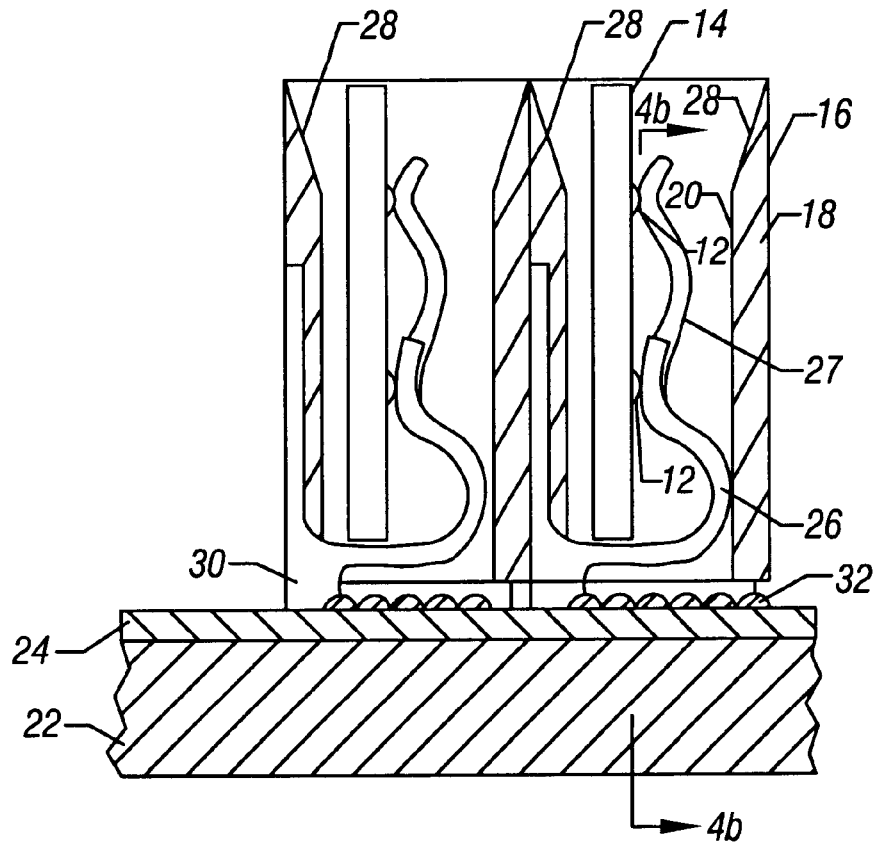
FIG. 4A is an enlarged cross-sectional view taken generally along line 4A—4A in FIG. 3.
Figure 4B:
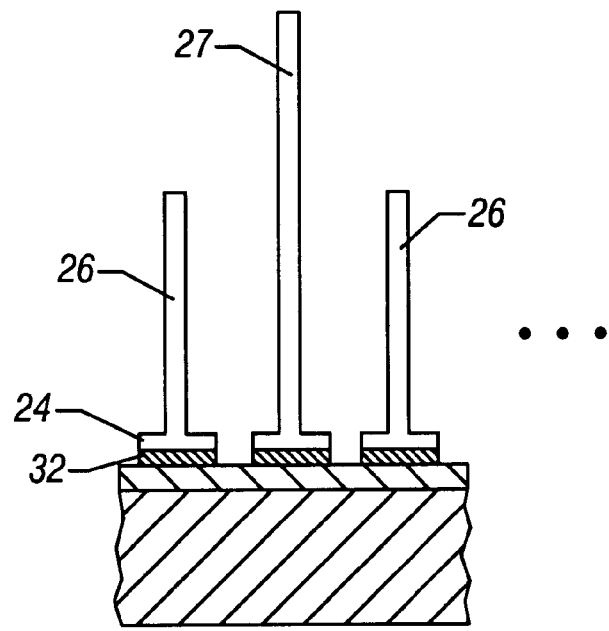
FIG. 4B is an enlarged cross-sectional view taken generally along line 4B—4B in FIG. 3.

Referring to FIGS. 3 and 4A–4B, a module 16 according to one embodiment for receiving DDC dies 120 includes a housing 18 and multiple die receiving sockets 20. A die can be inserted into and subsequently removed from each socket 20. Each die receiving socket 20 includes beveled side walls 28 (FIG. 4A) to facilitate insertion of a DDC die into the socket. The housing 18 of the module 16 can be molded from a suitable plastic material such as a thermoplastic compound or an epoxy molding compound (such as phenolic epoxy).

The module 16 is mounted to a supporting structure 22, e.g., an interconnecting substrate such as a printed circuit board or ceramic plate, to form multi-chip modules and other electrical components. The supporting substrate 22 can include patterns of conductors 24 that can be connected to the DDC dies in the sockets as well as other components.

As shown in FIGS. 4A and 4B, each die receiving socket includes electrical contacts in the form of leaf spring arms 26 and 27, which differ in length. To ensure that the spring arms maintain their preselected shape, they are made of a material that does not bend easily, such as metal. Each of the spring arms 26 and 27 can include a base 30 that can be bonded to the substrate using solder 32 (FIG. 4B). To facilitate soldering, the spring arms 26 and 27 can be formed of a solderable metal such as beryllium copper, or "PALLINEY 7" available from J. M. Ney Company of Hartford, Conn. Alternatively, the spring arm, 26 and 27 can be plated at regions where soldering will occur. Other bonding methods can also be used, such as using conductive adhesives to bond the base 30 of each spring arm to the interconnecting substrate. Conductive adhesives can include polymers such as metal filled epoxies and thermoplastic compounds.

For assembling the semiconductor module 16, the DDC dies 120 can be inserted into the sockets 20 using an insertion tool or loading mechanism (not shown). During assembly of the module 16, the bond pads on each die 120 are contacted to the spring arms 26 or 27. One method of forming the contacts between the bond pads and the spring arms is by merely physically touching the spring arms to the bond pads through the passivation windows created in the die. As each die is inserted into the socket, the spring arms scrub corresponding bond pads to create electrical connection. In this embodiment, the spring arms can be generally S-shaped or double-S-shaped so that the surface of the die makes tangential contact with the spring arms as the die is inserted into the socket. If desired, other spring arm shapes can be used. The passivation layer 161 protects the active area 160 of the die 120 as it is being inserted.

Another method of forming the contact between the bond pads and spring arms 26 or 27 is by use of solder bumps 12 formed on the bond pads on a surface 14 of the die 120. The solder bumps 12 are reflowed to form bonded metal-to-metal connections between the solder bumps and the spring arms 26 and 27. Fabrication of solder bumps on the die surface is described in co-pending and commonly assigned U.S. Ser. No. 08/905,602 entitled "Direct Die Contact (DDC) Semiconductor Package," which is hereby incorporated by reference.

The spring arms 26 and 27 in the module 16 vary in length. The first type spring arm 26 has a first length, and the second type spring arm 27 has a second length, with the first length being shorter than the second length. As a result, each of the two different length spring arms can contact a corresponding bond pad 122 or 124 on the surface 14 of the DDC die 120.

Figure 7:
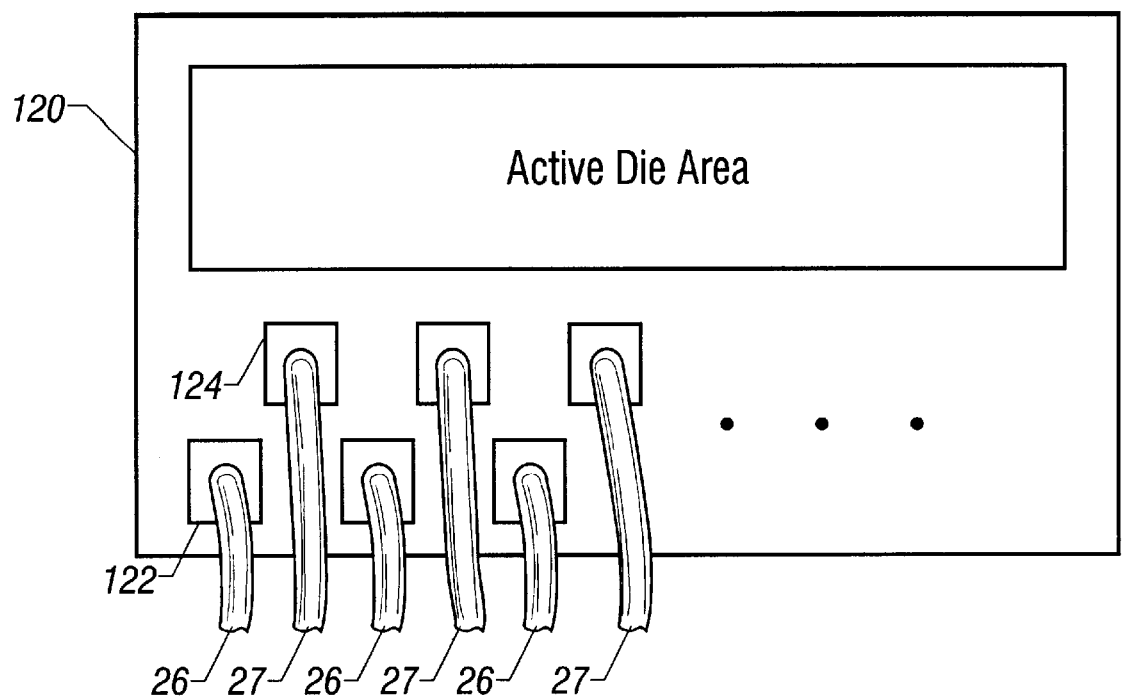
FIG. 7 is an enlarged top plan view of the die of FIG. 1 with spring arms in a module socket of FIG. 2 contacting the die bond pads.

Referring further to FIG. 7, the spring arms 26 contact corresponding bond pads 122 in the first row 128 of the DDC die 120. The spring arms 27 contact corresponding bond pads 124 in the second row 126. By thus vertically displacing bond pads on the die and by providing spring arms of varying lengths to contact the vertically displaced bond pads, a smaller pitch between bond pads can effectively be achieved between contacts, which in turn allows reduced sized dies having densely arranged bond pads to be used in DDC packages.

Figure 2:
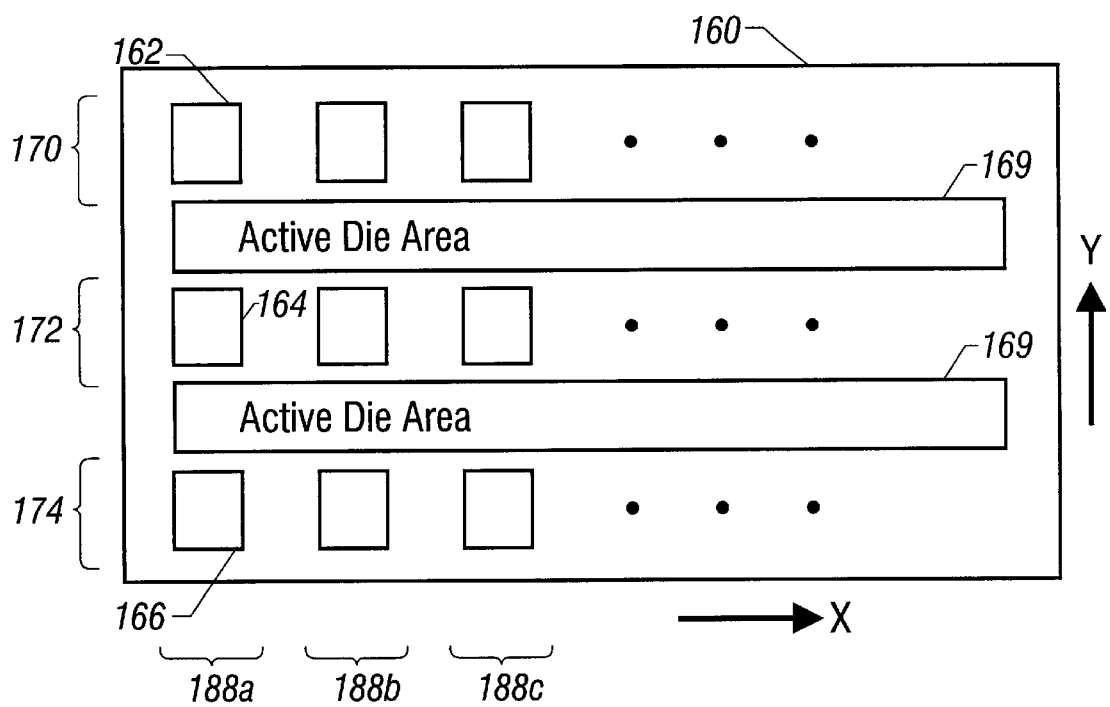
FIG. 2 is an enlarged, schematic top plan view of a die having a second configuration.

Referring to FIG. 2, in another embodiment, a DDC die 160 has an alternative bond pad arrangement (referred to as the vertically in-line arrangement) that allows for even greater density of bond pads on a die. For this description, rows along the surface of the die 160 run in the X direction and columns run along the Y direction.

The die 160 includes three rows (170, 172, and 174) of bond pads (162, 164, and 166, respectively) in the X direction. Along the Y direction, three bond pads 162, 164, and 166 are generally lined up in each of columns 188A, 188B, 188C, etc. Active areas 169 are generally defined between the bond pads. This bond pad arrangement allows contact to be made to three bond pads in a column 188 while requiring only the width of one bond pad in the X direction. A minimum pitch (e.g., 15 mils) is maintained between successive columns 188 of bond pads to reduce the likelihood of shorts between contacts.

Figure 5:
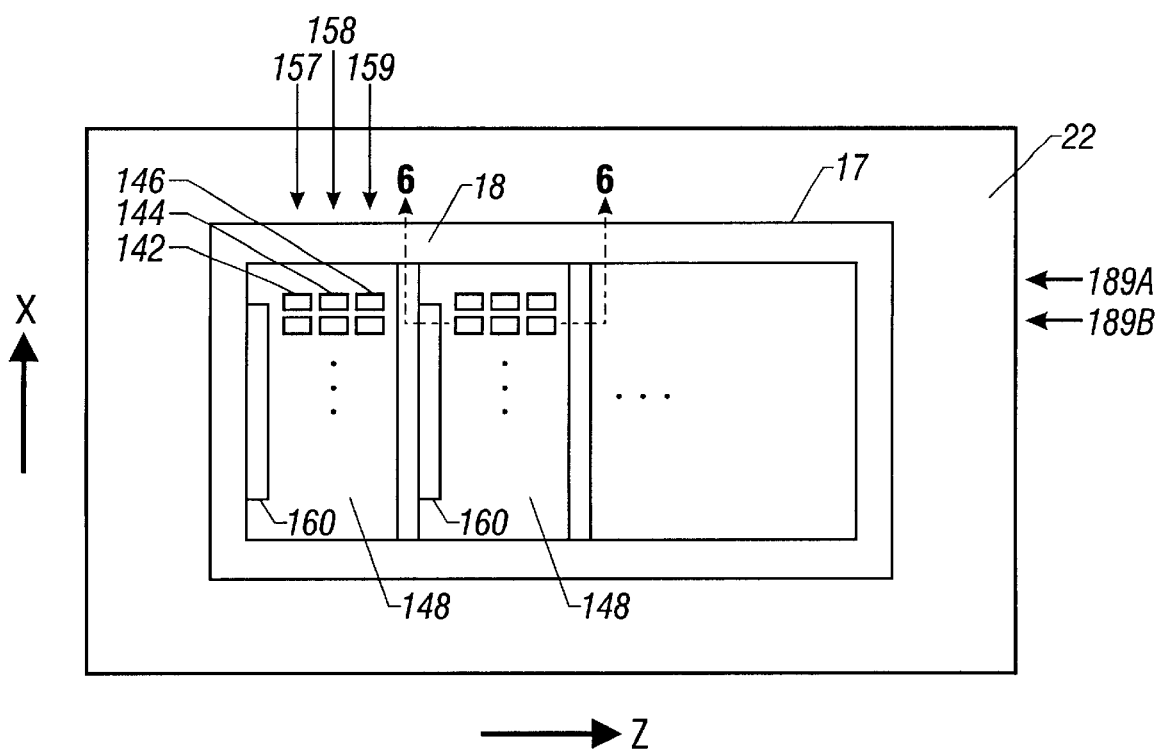
FIG. 5 is an enlarged top plan view of a module according to another embodiment of the invention that has sockets adapted to receive the die of FIG. 2.
Figure 6:
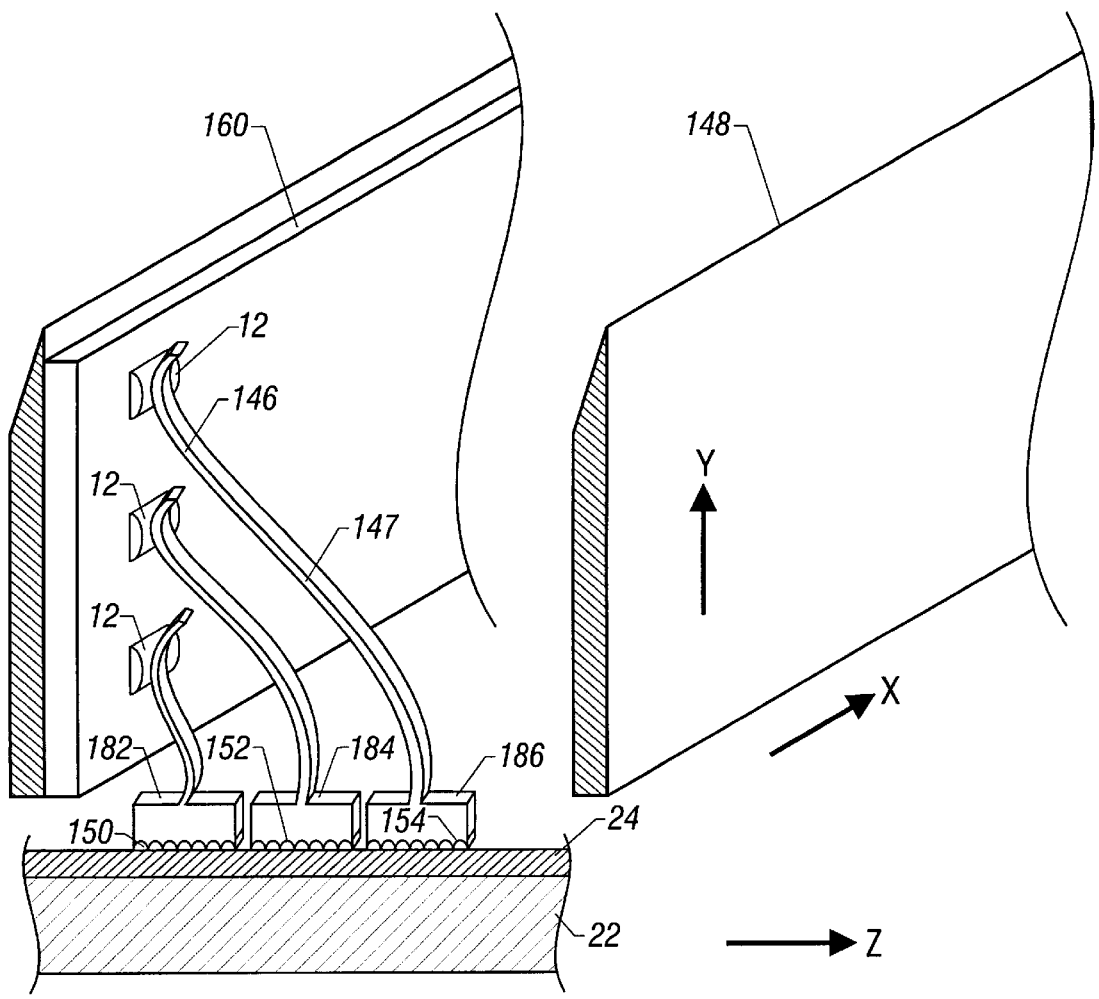
FIG. 6 is an enlarged, fragmentary cross-sectional view taken along the line 6—6 in FIG. 5.

Referring to FIGS. 5 and 6, a module 17 includes sockets 148 for receiving dies 160. The module 17 is mounted in the substrate 22. Rows along the surface of the substrate run in the X direction and columns run in the Z direction.

In one embodiment, the socket 148 includes three different types of spring arms (142, 144, and 146). The first type spring arm 142 has the shortest length, the second type spring arm 144 has an intermediate length, and the third type spring arm 146 has the longest length. Each of the spring arms 142, 144, and 146 is also generally S-shaped.

The three sets of spring arms 142, 144, and 146 have bases 182, 184, and 186, respectively, that are bonded onto the interconnecting substrate 22 using solder or conductive adhesives 152, 154, and 156, respectively, or by some other method. Each type of spring arm is arranged in one of the three rows 157, 158, and 159 (FIG. 5) in the X direction along the interconnecting substrate 22. As is the case with the bond pads 162, 164, and 166 on the die, the spring arms 142, 144, and 146 are generally lined up in a column 189 along the Z direction. As a result, the bond pads in one column 188 on the die 160 is aligned with the spring arms in one column 189 in the substrate 22. The socket 148 in the module 17 is widened with respect to the socket 20 in the module 16 due to the multiple rows of spring arms. The spring arms 144 and 146 have extended segments 145 and 147, respectively, to allow the arms to extend to the surface of the die 160 when it is inserted into the socket 148.

Figure 8:
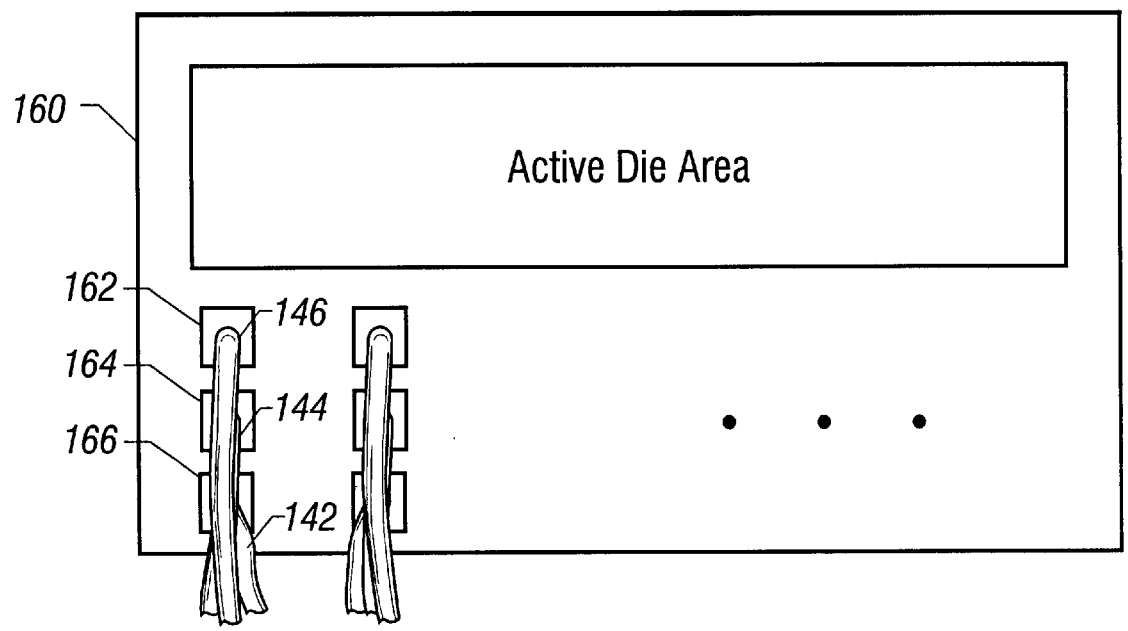
FIG. 8 is an enlarged top plan view of the die of FIG. 2 with spring arms in a module socket of FIG. 5 contacting the die bond pads.

As further shown in FIG. 8, the spring arms 142, 144, and 146 are generally lined up to align to the vertically in-line arrangement of the bond pads 162, 164, and 166, respectively. The first type spring arm 142 is positioned to make contact to the first bond pad 166 in the die 160, the second type spring arm 144 is positioned to contact the second bond pad 164, and the third type spring arm 146 is positioned to contact the third bond pad 162.

As noted, the vertically in-line contact arrangement of the module 17 requires a wider socket 148 than the socket 20 of the module 16. While the module 16 (FIG. 3) has only one row of spring arms 26 and 27, the module 17 (FIG. 5) has three rows of spring arms 142, 144, and 146. However, the module 17 provides sockets that can be used with higher density die bond pads than can the sockets of the module 16.

Other embodiments are also within the scope of the following claims. For example, even though the packages are shown with multiple die receiving sockets, the same concept can be applied to single die packages. The sockets can be use different types of contacts. In addition, although specific arrangements of bond pads have been shown, other arrangements can be used with differently configured sockets. The spring arms used in the sockets have been described with specific configurations and shapes; such configurations and shapes can be varied.

Many types of dies can be used, e.g., memory devices, application specific integrated circuits (ASICs), microcontrollers. Different busing schemes can be used on the substrate to electrically connect bus signals to corresponding contacts in the multichip module.

Although the present invention has been described with reference to specific exemplary embodiments, various modifications and variations may be made to these embodiments without departing from the spirit and scope of the invention as set forth in the claims.

What is claimed is:

1. An integrated circuit module, comprising:
   a die having bond pads;
   a socket adapted to receive the die; and
   contacts having varying lengths disposed in the socket to electrically contact the bond pads on the die.

2. The module of claim 1, wherein the bond pads on the die are arranged generally in multiple rows.

3. The module of claim 1, further comprising at least one other socket adapted to receive at least another die.

4. The module of claim 1, wherein the die includes a direct die contact die.

5. The module of claim 1, wherein the module is disposed on a substrate, the contacts in the socket being electrically contacted to the substrate.

6. The module of claim 5, wherein the contacts are arranged generally in one row on the substrate.

7. The module of claim 5, wherein the contacts are arranged generally in multiple rows on the substrate.

8. The module of claim 7, wherein the bond pads are arranged generally in multiple rows on the die to mate to corresponding rows of contacts in the socket.

9. The module of claim 5, wherein the bond pads are arranged generally in multiple rows on the die to mate to corresponding rows of contacts in the socket.

10. The module of claim 1, wherein the contacts include spring arms shaped to contact the bond pads on the die as the die is inserted into the socket.

11. A chip-carrying module, comprising:
    a socket for receiving a die having first and second sets of bond pads;
    a first contact having a first length disposed in the socket for electrically contacting the first set of bond pads on the die; and
    a second contact having a second length disposed in the socket for electrically contacting to a second set of bond pads on the die,
    the first length being different from the second length.

12. The module of claim 11, further comprising a support structure, the contacts being bonded to the support structure.

13. The module of claim 11, wherein the socket is adapted to enclose generally one row of contacts along the support structure.

14. The module of claim 11, wherein the socket is adapted to enclose generally multiple rows of contacts along the support structure.

15. The module of claim 11, further comprising at least another type of contact that has a length different form the first and second lengths.

16. The module of claim 11, further comprising at least another socket to receive at least another die.

17. The module of claim 11, wherein the die includes a direct die contact die.

18. A semiconductor module, comprising:
    a die having bond pads that are displaced with respect to one another along a particular direction; and
    a socket configured to receive the die, the socket having contacts for electrically contacting the die.

19. The module of claim 18, wherein the bond pads are generally arranged in multiple rows.

20. The module of claim 18, wherein the socket includes contacts of different lengths to electrically contact the bond pads.

21. The module of claim 18, further comprising at least another socket and at least another die positioned in the other socket.

22. Apparatus for forming electrical connections to bond pads on a die, the apparatus comprising:
    a socket for receiving the die; and
    contacts formed inside the socket to contact the bond pads,
    wherein the contacts have varying lengths.

23. The apparatus of claim 22, wherein the contacts include a first set of contacts each having first length and a second set of contacts each having a second, different length.

24. The apparatus of claim 23, wherein the contacts further include at least another set of contacts each having a length different than the first and second lengths.

* * * * *